United States Patent
Damphousse et al.

[11] Patent Number: 6,140,698
[45] Date of Patent: Oct. 31, 2000

[54] PACKAGE FOR MICROWAVE AND MM-WAVE INTEGRATED CIRCUITS

[75] Inventors: Simon J. Damphousse, Nepean; Tom Cameron, Stittsville; Ingrid M. Mag, Ottawa, all of Canada

[73] Assignee: Nortel Networks Corporation, Montreal, Canada

[21] Appl. No.: 09/217,059

[22] Filed: Dec. 21, 1998

[51] Int. Cl.$^7$ .................................................. H01L 23/12
[52] U.S. Cl. ........................................ 257/704; 257/728
[58] Field of Search ................................ 257/704, 710, 257/728, 257, 659, 660, 723, 724, 725; 333/246, 247

[56] References Cited

U.S. PATENT DOCUMENTS

| | | | |
|---|---|---|---|
| 4,038,488 | 7/1977 | Lin | 257/723 |
| 4,259,684 | 3/1981 | Dean et al. | 357/74 |
| 4,891,614 | 1/1990 | De Ronde | 333/122 |
| 5,142,352 | 8/1992 | Chambers et al. | 257/728 |
| 5,235,208 | 8/1993 | Katoh | 257/728 |
| 5,294,897 | 3/1994 | Notani et al. | 333/33 |
| 5,317,478 | 5/1994 | Sobani | 257/710 |
| 5,448,826 | 9/1995 | Goetz et al. | 29/848 |
| 5,451,818 | 9/1995 | Chan et al. | 257/728 |
| 5,543,663 | 8/1996 | Takubo | 257/704 |
| 5,554,824 | 9/1996 | Ueda et al. | 257/704 |
| 5,574,314 | 11/1996 | Okada et al. | 257/728 |

FOREIGN PATENT DOCUMENTS

| | | | |
|---|---|---|---|
| 62-249458 | 10/1987 | Japan | 257/704 |
| 3-273667 | 12/1991 | Japan | 257/704 |
| 5-198610 | 8/1993 | Japan | 257/704 |

*Primary Examiner*—Donald L. Monin, Jr.
*Assistant Examiner*—Michael Dietrich

[57] ABSTRACT

A microwave integrated circuit package is disclosed. The package consists of a package substrate, having conductive vias, at least one ground plane, and conductive transmission lines; a semiconductor die electrically and mechanically connected to the top surface of the package substrate; a continuous outer wall attached to the top surface of the package substrate and at least one interior wall at a distance from a second wall, which may be the outer wall; a lid; at least one of the transmission lines passing under the interior wall and the second wall carrying a signal of frequency F; and an impedance transformer on the transmission line between the interior wall and the second wall. In operation, the interior wall, the distance between the interior wall and the second wall and the impedance transformer cancel the discontinuity caused by the second wall whereby the reflection of the signal caused by the transmission line passing under the walls is greatly diminished.

35 Claims, 4 Drawing Sheets

PACKAGE FOR MICROWAVE AND MM-WAVE INTEGRATED CIRCUITS

FIELD OF THE INVENTION

This invention relates to integrated circuit packages in general, and specifically to hermetically sealed microwave and mm-wave integrated circuit packages.

BACKGROUND OF THE INVENTION

The typical design of a microwave or mm-wave package has a ceramic substrate with a plurality of conductive microstrip transmission lines on the outside and between the layers of ceramic and vias to interconnect the transmission lines. An integrated circuit die is fixed, by means of an adhesive, in a central recess and is wire bonded to connect to the transmission lines. A continuous metal wall is positioned on and sealed to the perimeter of the ceramic substrate. The transmission lines do not pass under the metal wall. Instead, metal pins pass through holes in the wall. The pins are sealed to the wall and electrically isolated from it by a glass seal which fills the holes surrounding the pins. Transmission lines which need to be connected to the external environment are wire bonded to the end of the pins internal to the package. The package is then hermetically sealed by placing a metal lid on top of the wall and sealing the lid to the wall. In this design, signals are transmitted into and out of the package through the pins.

Sometimes there are advantages, both in cost and performance, to having the transmission lines pass under the wall. In such a design, there are no pins present. The transmission lines pass under a ceramic wall and connection is made from the ceramic substrate to the outside world by any one of a number of interconnection means, including solder or ribbon bonding.

Another technique provides interconnection between the inside and outside of the package by the use of vias which extend through the package substrate. Transmission lines are connected through the vias to conductive balls arrayed upon the bottom of the package. In this design, referred to as a ball grid array (BGA) package, the conductive balls are used to electrically connect the package to a microwave board.

There are performance problems with all of these scenarios. The performance characteristics of BGA packages makes them unsuitable for high power applications. The wire-bonding of the transmission lines to the pins of the typical design results in substantial losses which may not be acceptable. Similarly, passing transmission lines under the wall creates a discontinuity resulting in the reflection of a portion of the signal. As frequency increases, the discontinuity of the wall becomes more significant causing voltage standing wave ratio to deteriorate the performance to an unacceptable level.

One way in which the discontinuity caused by the wall has been compensated for has been to narrow the transmission line as it passes under the wall. However, this may pose manufacturing and performance problems.

SUMMARY OF THE INVENTION

It is an object of the present invention to provide an improved microwave or mm-wave integrated circuit package in which one or more of the disadvantages of the prior art is obviated or mitigated.

Therefore, the invention may be summarized according to a first broad aspect as an integrated circuit package comprising: a dielectric package substrate having a plurality of conductive transmission lines located thereon; at least one integrated circuit die mounted on a top surface of the dielectric package substrate and electrically connected to at least some of the plurality of conductive transmission lines; a continuous outer dielectric wall sealed to the dielectric package substrate and defining a cavity; at least one conductive transmission line, of the plurality of conductive transmission lines, passing under the outer dielectric wall for carrying a signal of frequency F; at least one inner dielectric wall spaced apart a distance from the outer dielectric wall over the at least one conductive transmission line; the at least one inner dielectric wall being of substantially the same width and height as the outer dielectric wall such that in operation it presents a discontinuity effect substantially the same as a discontinuity effect presented by the outer dielectric wall; a plate sealed to a top of the outer dielectric wall and a top of the inner dielectric wall enclosing the cavity created by the outer dielectric wall creating a hermetic enclosure for the integrated circuit die; and an impedance transformer on the conductive transmission line between the outer dielectric wall and the inner dielectric wall; such that at frequency F, the combination of the inner dielectric wall, the distance between the inner dielectric wall and the outer dielectric wall and the impedance transformer cancel out the discontinuity effect created in the at least one conductive transmission line by the outer dielectric wall.

According to another aspect of the present invention, there is provided an integrated circuit package comprising: a multi-layer dielectric package substrate; the dielectric package substrate having a plurality of conductive transmission lines located thereon at least one ground plane, and a plurality of conductive vias interconnecting at least some of said conductive transmission lines to the ground plane; at least one integrated circuit die mounted on a top surface of the dielectric package substrate and electrically connected to at least some of the plurality of conductive transmission lines; a continuous outer dielectric wall sealed to the dielectric package substrate and defining a cavity; the continuous outer dielectric wall having a conductive top surface; at least one conductive transmission line, of the plurality of conductive transmission lines, passing under the outer dielectric wall for carrying a signal of frequency F; at least one inner dielectric wall spaced apart a distance from the outer dielectric wall over the at least one conductive transmission line; the at least one inner dielectric wall being of substantially the same width and height as the outer dielectric wall such that in operation it presents a discontinuity effect substantially the same as a discontinuity effect presented by the outer dielectric wall, and having a conductive top surface; a conductive plate sealed to the top of the outer dielectric wall and to the top of the inner dielectric wall enclosing the cavity created by the outer dielectric wall and creating a hermetic enclosure for the integrated circuit die; at least one electrical connection means electrically connecting the conductive top plate to the at least one ground plane; and an impedance transformer on the at least one conductive transmission line between the outer dielectric wall and the inner dielectric wall; such that at frequency F, the combination of the inner dielectric wall, the distance between the inner dielectric wall and the outer dielectric wall and the impedance transformer cancel out the discontinuity effect created in the at least one conductive transmission line by the outer dielectric wall.

According to further aspect of the present invention, there is provided an integrated circuit package comprising: a dielectric package substrate having a plurality of conductive transmission lines located thereon; at least two integrated circuits mounted on a top surface of the dielectric package substrate and electrically connected to at least some of the plurality of conductive transmission lines; an continuous outer dielectric wall sealed to the dielectric package substrate and defining a cavity; a second dielectric wall and a third dielectric wall, of substantially the same height and width, such that in operation they present substantially the same discontinuity effect, separating the at least two integrated circuits and spaced apart a distance; the second and third dielectric walls sealing to the outer dielectric wall and the dielectric package substrate and defining a cavity for each of the integrated circuit dies; at least one conductive transmission line passing under the second and third dielectric walls for carrying a signal of frequency F; a plate sealed to a top of the outer dielectric wall, the second dielectric wall and the third dielectric wall creating hermetic enclosures for each of the integrated circuit dies; and an impedance transformer on the at least one conductive transmission line between the second dielectric wall and the third dielectric wall; such that at frequency F, the combination of the third dielectric wall, the distance between the second dielectric wall and the third dielectric wall, and the impedance transformer cancel out the discontinuity effect created by the second dielectric wall in the at least one conductive transmission line.

An advantage of this invention is that it minimizes the electrical transmission losses and voltage standing wave ratio (VSWR) in the package caused by reflection.

Another advantage of this invention is that it allows for a broader range of connection mechanisms.

Yet another advantage is that the invention minimizes the cost of the package.

Finally, the invention provides for easier assembly as the walls may be formed integral to the substrate.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 1:
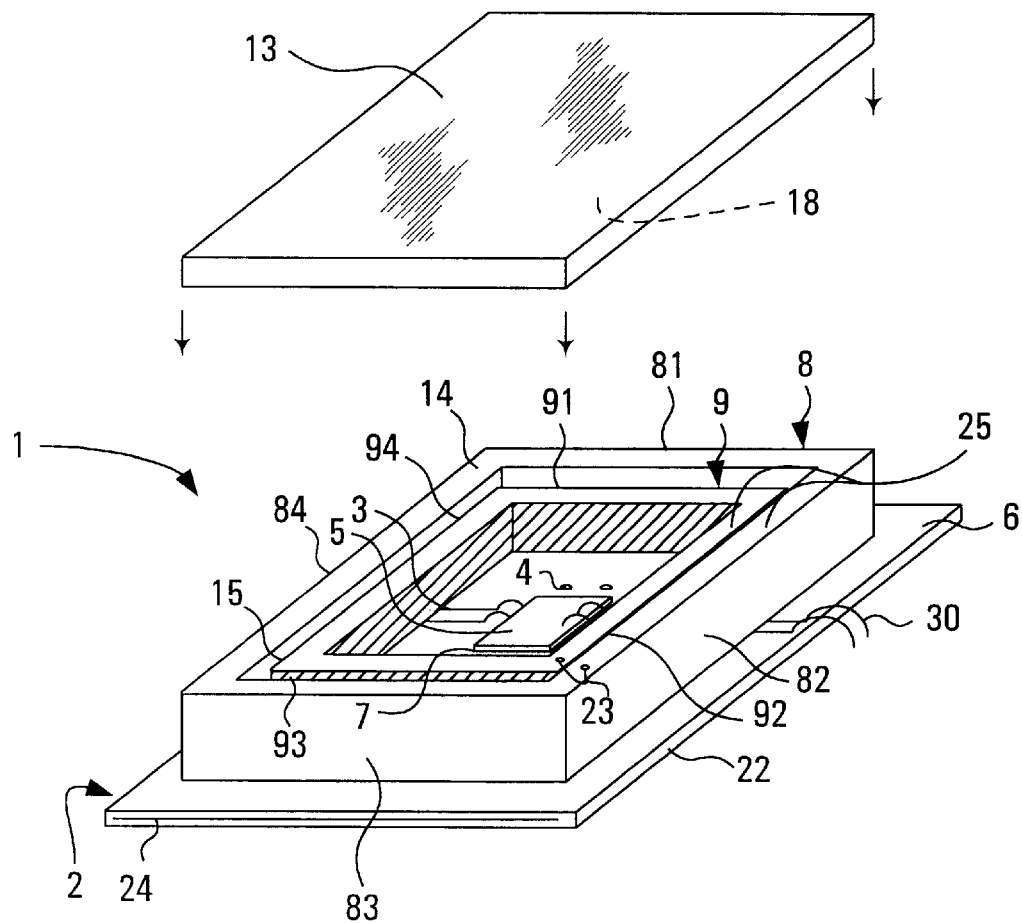
FIG. 1 is a perspective view of a microwave or mm-wave integrated circuit package, before the lid is attached, in accordance with the present invention.

FIG. 1 depicts a package 1 which includes a multi-layer ceramic substrate 2 containing a plurality of conductive microstrip transmission lines 3 and a plurality of conductive vias 4 interconnecting the transmission lines located upon the ceramic layers. Ceramic substrate 2 also has at least one ground plane 24. An integrated circuit die 5 is connected by means of an adhesive 7 to a central location on a top surface 6 of ceramic substrate 2. Integrated circuit die 5 is also electrically connected to transmission lines 3. Although wire bonding is shown in FIG. 1, other suitable methods used in the art, e.g. flip-chip or tape automated bonding (TAB), can be used to electrically connect integrated circuit die 5 to transmission lines 3.

The package further comprises an outer wall 8 and an inner wall 9. Outer wall 8 is comprised of outer side walls 81, 82, 83 and 84. Similarly, inner wall 9 is comprised of inner side walls 91, 92, 93, and 94. Both outer wall 8 and inner wall 9 are preferably comprised of ceramic and may be integrally manufactured with ceramic substrate 2. Both outer wall 8 and inner wall 9 preferably have a top metal layer 25 and plated vias 23 to connect top metal 25 to the ground plane 24 of ceramic substrate 2. Plated vias 23 are located in walls 8 and 9 at the same distance from transmission lines 3. Alternatively, outer wall 8 and inner wall 9 may be independently manufactured and connected to top surface 6 of ceramic substrate 2 by means of an adhesive 10 (not shown). Adhesive 10 may be an epoxy or a heat cured epoxy.

Figure 2:
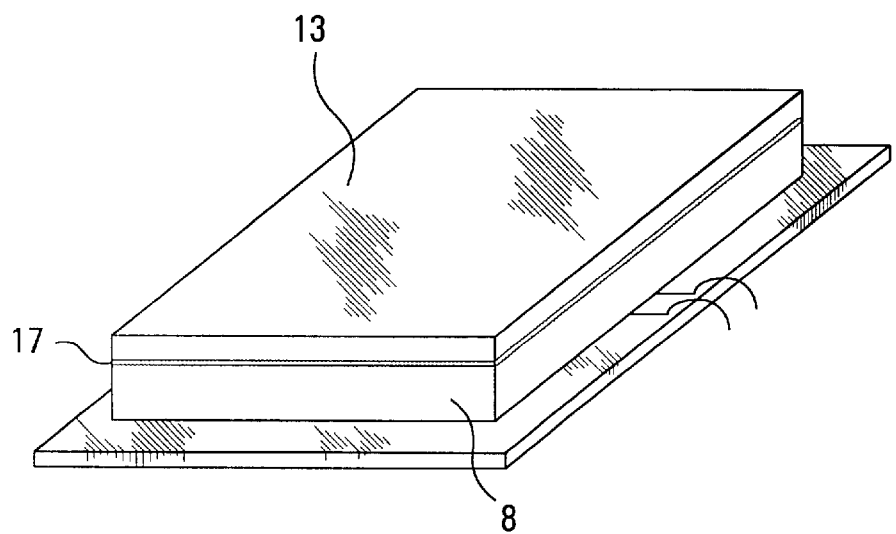
FIG. 2 is a perspective view of the integrated circuit package of FIG. 1 with the lid attached.

Inner wall 9, as shown in FIG. 1, constitutes a complete inner wall spaced inwardly from outer wall 8. If, however, transmission lines 3 pass under fewer than the four outer side walls 81, 82, 83 and 84, for example, transmission lines 3 pass under outer side wall 82 only, there need only be an inner side wall, in this example inner side wall 92, spaced inwardly from the outer side walls 81, 82, 83, and 84 which have transmission lines passing under them. A lid 13 is formed of metal and is secured, as shown in FIG. 2, to the upper surface 14 of outer wall 8 and the upper surface 15 of inner wall 9 by means of an adhesive or weld 17. Adhesive or weld 17 forms a complete seal between upper surface 14 of outer wall 8 and bottom surface 18 of lid 13 such that package 1 is hermetically sealed. Hermetic sealing is desirable to prevent contamination which could lead to failure of the package.

Figure 3:
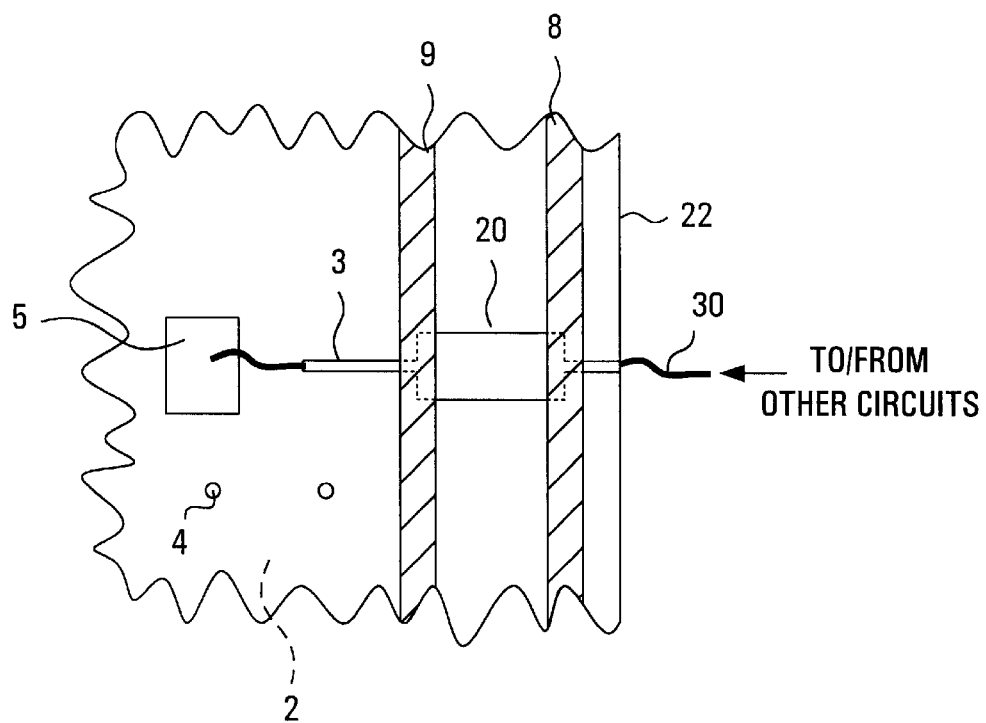
FIG. 3 is a top view, drawn at a larger scale, of a portion of the integrated circuit package of FIG. 1.

Looking at the portion of package 1 depicted in FIG. 3, inner wall 9 and outer wall 8 are shown to be spaced apart by impedance transformer 20 which extends between the midpoints of inner wall 9 and outer wall 8. This package construction will support both microwave and mm-wave transmission line signals. Impedance transformer 20 is simply an increased width portion of transmission line 3. The purpose of the increased width is to compensate for the change in impedance of transmission line 3 when it passes beneath inner wall 9 and outer wall 8. The width of the impedance transformer 20, the distance between inner wall 9 and outer wall 8, and the discontinuity effect caused by inner wall 9 and outer wall 8 are interdependent. Thus, for a given frequency of the signal carried by transmission line 3, and a given discontinuity effect caused by inner wall 9 and outer wall 8, the required size of the impedance transformer can be adjusted by changing the distance between inner wall 9 and outer wall 8. For practical manufacturing purposes, the distance between inner wall 9 and outer wall 8 can be set at substantially $\lambda/4$ and the width of impedance transformer 20 determined by numerical methods such as finite difference time domain analysis; however, it is also possible to set another perameter, such as the width of impedance transformer 20, and calculate the required wall spacing. Inner wall 9 serves no structural function. It is present only to cancel the discontinuity caused by outer wall 8 and to help match the transmission line to the characteristic impedance. As such, the height and width of inner wall 9 and outer wall 8 are designed to be the same in order to produce the same discontinuity effect.

Once transmission line 3 crosses under inner wall 9 and outer wall 8, it terminates at or near the edge 22 of ceramic substrate 2. Transmission line 3 is connected to the outside environment, such as a printed circuit board, by any one of several means such as ribbon bonding or by the soldering of brazed pins 30.

Figure 4:
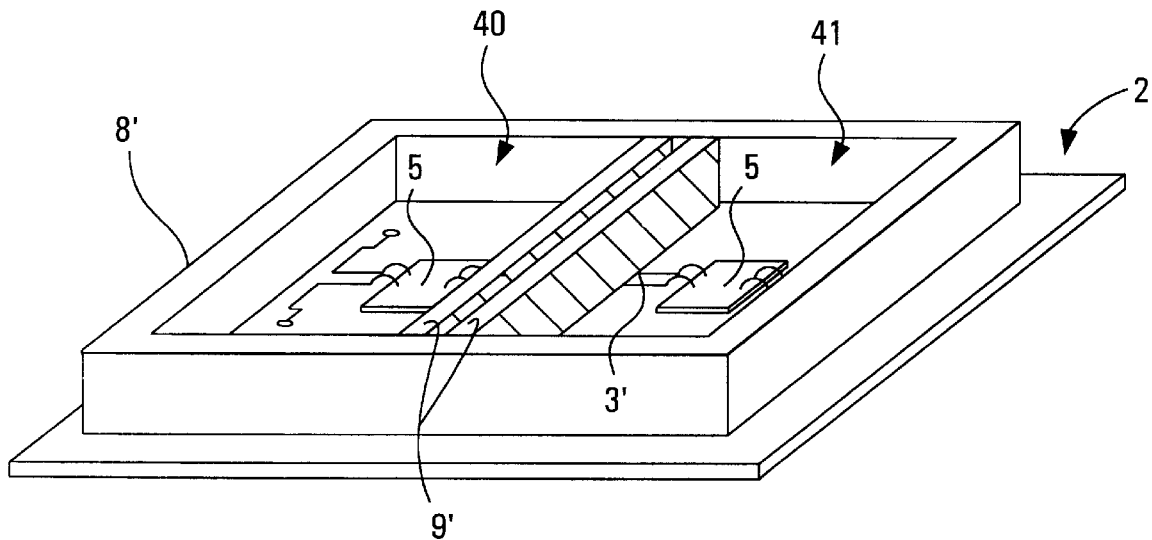
FIG. 4 is a perspective view of another embodiment of the present invention, before the lid is attached.

FIG. 4 depicts another embodiment of the invention. In this embodiment, a single perimeter or outer wall 8' is provided and two mutually spaced inner walls 9' define, with respect to outer wall 8', two cavities 40 and 41 in the integrated circuit package which are isolated from each other. Each cavity has an integrated circuit die 5. Connection between the two integrated circuits is performed by transmission lines 3'. Inner walls 9' are spaced apart by an impedance transformer (not shown) placed between the inner walls 9'. The function of the two inner walls 9' is the same as the function of inner wall 9 and outer wall 8 previously discussed and the structure and function of the impedance transformer is the same as that discussed in relation to FIG. 3. Double walls may also exist near the perimeter, as shown in FIG. 1, instead of a single wall 8', if there are also transmission lines 3 (not shown) which extend to the edge of ceramic substrate 2.

Figure 5:
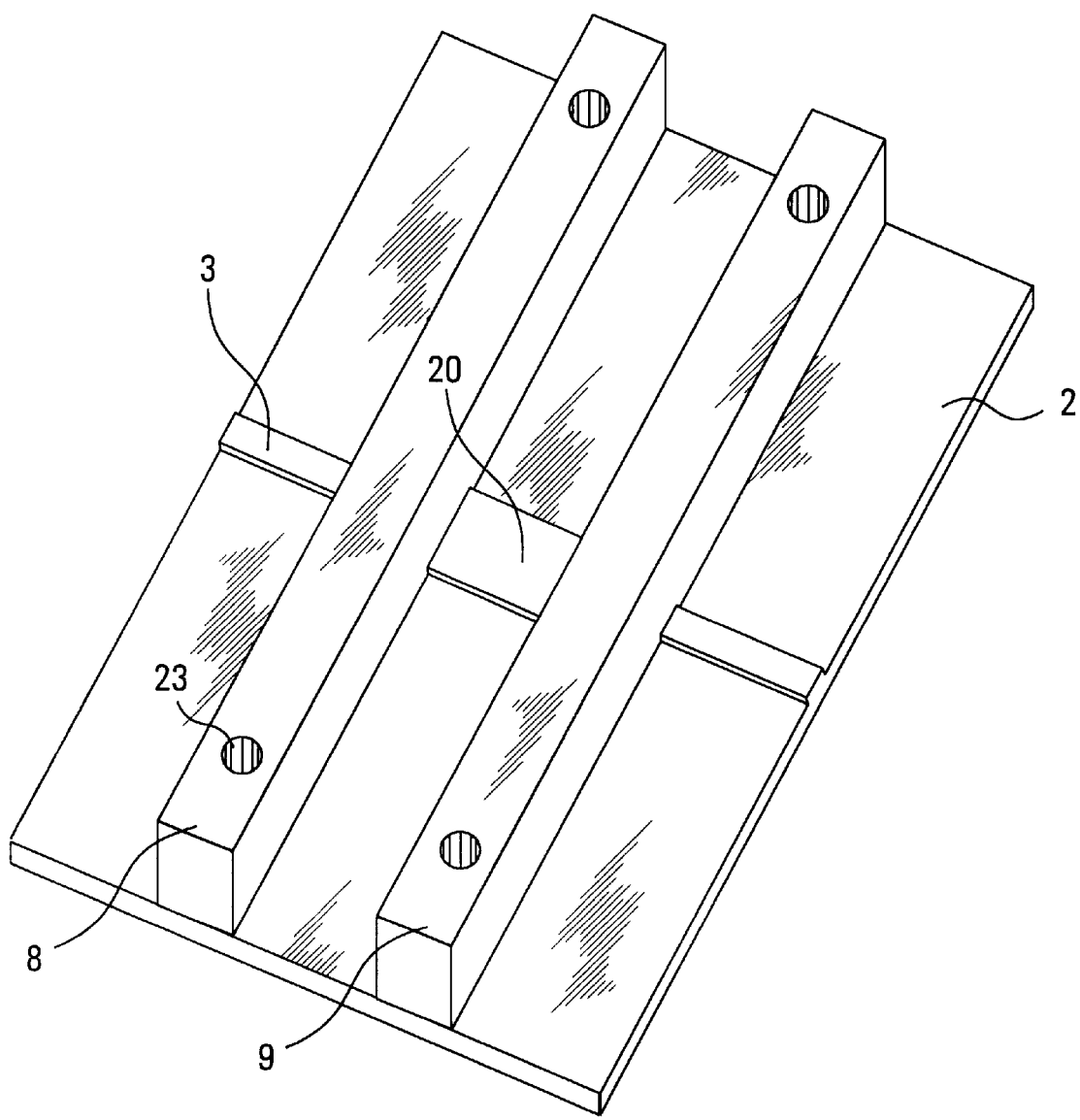
FIG. 5 is a perspective view of a portion of the integrated circuit package of FIG. 1, showing dimensions, for which finite difference time domain modelling was conducted.

FIG. 5 shows dimensions used for modelling of the preferred embodiment. Transmission line 3 is 10 mils wide. Walls 8 and 9 are both 40 mils high and 20 mils wide. The distance between the walls is 40 mils. The width of the impedance transformer 20 is 16 mils. The thickness of substrate 2 is 10 mils. The distance between the centre of transmission line 3 and the centre of vias 23 is 100 mils.

Figure 6:
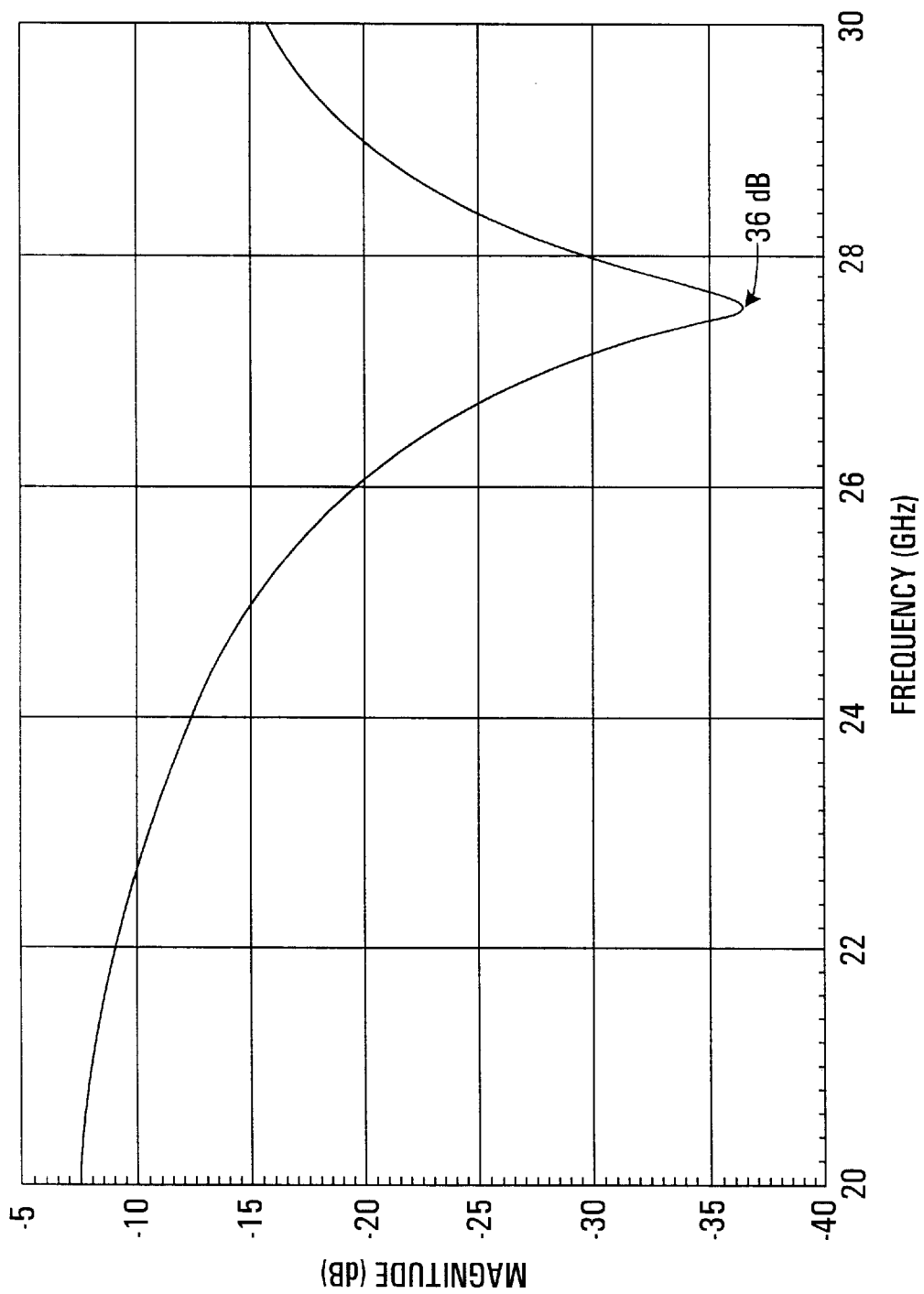
FIG. 6 is a graph which depicts the results of the finite difference time domain analysis of the package configuration of FIG. 5.

FIG. 6 shows the results of finite difference time domain analysis of the configuration shown in FIG. 5. The horizontal axis shows the frequency of the signal in gigahertz (GHz) and the vertical axis shows the magnitude of the reflection coefficient in decibels (dB). The higher the magnitude, the higher the reflection. For the present configuration the optimum frequency for the signal of transmission line 3 is of 27.5 GHz; at that frequency the reflection coefficient is −36 dB. The percentage reflection 20 log (reflection coefficient); in the present example, less than 0.05% reflection.

While the preferred embodiment, in addition to alternative forms of the invention, has been described and illustrated, it will be apparent to one skilled in the art that further variations in the design may be made. The scope of the invention, therefore, is only to be limited by the claims appended hereto.

What is claimed is:

1. An integrated circuit package comprising:
a dielectric package substrate having a plurality of conductive transmission lines located thereon;
at least one integrated circuit die mounted on a top surface of the dielectric package substrate and electrically connected to at least some of the plurality of conductive transmission lines;
a continuous outer dielectric wall sealed to the dielectric package substrate and defining a cavity;
at least one conductive transmission line, of the plurality of conductive transmission lines, passing under the outer dielectric wall for carrying a signal of frequency F;
at least one inner dielectric wall spaced apart a distance from the outer dielectric wall over the at least one conductive transmission line;
the at least one inner dielectric wall being of substantially the same width and height as the outer dielectric wall such that in operation it presents a discontinuity effect substantially the same as a discontinuity effect presented by the outer dielectric wall;
a plate sealed to a top of the outer dielectric wall and a top of the inner dielectric wall enclosing the cavity created by the outer dielectric wall creating a hermetic enclosure for the integrated circuit die; and
an impedance transformer in the conductive transmission line between the outer dielectric wall and the inner dielectric wall;
such that at frequency F, the combination of the inner dielectric wall, the distance between the inner dielectric wall and the outer dielectric wall and the impedance transformer cancel out the discontinuity effect created in the at least one conductive transmission line by the outer dielectric wall.

2. An integrated circuit package as claimed in claim 1 wherein the impedance transformer comprises a widening of the at least one conductive transmission line.

3. An integrated circuit package as claimed in claim 2 wherein the widening of the at least one conductive transmission line is a rectangular widening which begins at substantially a midpoint of the at least one inner dielectric wall and ends at substantially a midpoint of the outer dielectric wall.

4. An integrated circuit package as claimed in claim 1 with the additional features of a ground plane embedded in the dielectric substrate, the outer dielectric wall having a metal top surface, the inner dielectric wall having a metal top surface, the top plate being conductive, at least one plated via extending through each of the outer dielectric wall and the inner dielectric wall at substantially the same distance from the at least one conductive transmission line; whereby the plated vias electrically connect the ground plane to the top plate.

5. An integrated circuit package as claimed in claim 1 wherein the inner dielectric wall comprises a continuous wall defining an inner cavity.

6. An integrated circuit package as claimed in claim 1 wherein the integrated circuit is a microwave integrated circuit.

7. An integrated circuit package as claimed in claim 1 wherein the integrated circuit is a mm-wave integrated circuit.

8. An integrated circuit package as claimed in claim 1 wherein the dielectric package substrate, the outer dielectric wall and the inner dielectric wall are comprised of ceramic.

9. An integrated circuit package as claimed in claim 8 wherein the dielectric walls are integrally manufactured with the dielectric package substrate.

10. An integrated circuit package as claimed in claim 8 wherein the dielectric walls are formed separately from the dielectric package substrate and the dielectric walls are attached to the dielectric package substrate by means of an adhesive.

11. An integrated circuit package as claimed in claim 1 wherein the wavelength of the signal carried by the at least one conductive transmission line is X and the distance between the inner dielectric wall and the outer dielectic wall is substantially $\lambda/4$.

12. An integrated circuit package as claimed in claim 1 wherein the wavelength of the signal is of microwave or mm-wave frequencies.

13. An integrated circuit package comprising:
a multi-layer dielectric package substrate;
the dielectric package substrate having a plurality of conductive transmission lines located thereon at least one ground plane, and a plurality of conductive vias interconnecting at least some of said conductive transmission lines to the ground plane;

at least one integrated circuit die mounted on a top surface of the dielectric package substrate and electrically connected to at least some of the plurality of conductive transmission lines;

a continuous outer dielectric wall sealed to the dielectric package substrate and defining a cavity;

the continuous outer dielectric wall having a conductive top surface;

at least one conductive transmission line, of the plurality of conductive transmission lines, passing under the outer dielectric wall for carrying a signal of frequency F;

at least one inner dielectric wall spaced apart a distance from the outer dielectric wall over the at least one conductive transmission line;

the at least one inner dielectric wall being of substantially the same width and height as the outer dielectric wall such that in operation it presents a discontinuity effect substantially the same as a discontinuity effect presented by the outer dielectric wall, and having a conductive top surface;

a conductive plate sealed to the top of the outer dielectric wall and to the top of the inner dielectric wall enclosing the cavity created by the outer dielectric wall and creating a hermetic enclosure for the integrated circuit die;

at least one electrical connection means electrically connecting the conductive top plate to the at least one ground plane; and an impedance transformer in the at least one conductive transmission line between the outer dielectric wall and the inner dielectric wall;

such that at frequency F, the combination of the inner dielectric wall, the distance between the inner dielectric wall and the outer dielectric wall and the impedance transformer cancel out the discontinuity effect created in the at least one conductive transmission line by the outer dielectric wall.

14. An integrated circuit package as claimed in claim 13 wherein the impedance transformer comprises a widening of the at least one conductive transmission line.

15. An integrated circuit package as claimed in claim 14 wherein the widening of the at least one conductive transmission line is a rectangular widening which begins at substantially a midpoint of the at least one inner dielectric wall and ends at substantially a midpoint of the outer dielectric wall.

16. An integrated circuit package as claimed in claim 13 wherein the at least one electrical connection means comprises at least one plated via extending through each of the outer dielectric wall and the inner dielectric wall at substantially the same distance from the at least one conductive transmission line; whereby the plated vias electrically connect the ground plane to the top plate.

17. An integrated circuit package as claimed in claim 13 wherein the inner dielectric wall comprises a continuous wall defining an inner cavity.

18. An integrated circuit package as claimed in claim 13 wherein the integrated circuit is a microwave integrated circuit.

19. An integrated circuit package as claimed in claim 13 wherein the integrated circuit is a mm-wave integrated circuit.

20. An integrated circuit package as claimed in claim 13 wherein the dielectric package substrate, the outer dielectric wall and the inner dielectric wall are comprised of ceramic.

21. An integrated circuit package as claimed in claim 20 wherein the dielectric walls are integrally manufactured with the dielectric package substrate.

22. An integrated circuit package as claimed in claim 20 wherein the dielectric walls are formed separately from the dielectric package substrate and the dielectric walls are attached to the dielectric package substrate by means of an adhesive.

23. An integrated circuit package as claimed in claim 13 wherein the wavelength of the signal carried by the at least one conductive transmission line is $\lambda$ and the distance between the inner dielectric wall and the outer dielectic wall is substantially $\lambda/4$.

24. An integrated circuit package as claimed in claim 13 wherein the wavelength of the signal is of microwave or mm-wave frequencies.

25. An integrated circuit package comprising:

a dielectric package substrate having a plurality of conductive transmission lines located thereon;

at least two integrated circuits mounted on a top surface of the dielectric package substrate and electrically connected to at least some of the plurality of conductive transmission lines;

an continuous outer dielectric wall sealed to the dielectric package substrate and defining a cavity;

a second dielectric wall and a third dielectric wall, of substantially the same height and width, such that in operation they present substantially the same discontinuity effect, separating the at least two integrated circuits and spaced apart a distance;

the second and third dielectric walls sealing to the outer dielectric wall and the dielectric package substrate and defining a cavity for each of the integrated circuit dies;

at least one conductive transmission line passing under the second and third dielectric walls for carrying a signal of frequency F;

a plate sealed to a top of the outer dielectric wall, the second dielectric wall and the third dielectric wall creating hermetic enclosures for each of the integrated circuit dies; and an impedance transformer in the at least one conductive transmission line between the second dielectric wall and the third dielectric wall;

such that at frequency F, the combination of the third dielectric wall, the distance between the second dielectric wall and the third dielectric wall, and the impedance transformer cancel out the discontinuity effect created by the second dielectric wall in the at least one conductive transmission line.

26. An integrated circuit package as claimed in claim 25 wherein the impedance transformer comprises a widening of the at least one conductive transmission line.

27. An integrated circuit package as claimed in claim 26 wherein the widening of the at least one conductive transmission line is a rectangular widening which begins at substantially a midpoint of the at least one inner dielectric wall and ends at substantially a midpoint of the outer dielectric wall.

28. An integrated circuit package as claimed in claim 25 with the additional features of a ground plane embedded in the dielectric substrate, the outer dielectric wall having a metal top surface, the second dielectric wall having a metal top surface, the third dielectric wall having a metal top surface, the top plate being conductive, at least one plated via extending through the outer dielectric wall, at least one plated via extending through each of the second dielectric wall and the third dielectric wall at substantially the same distance from the at least one conductive transmission line; whereby the plated vias electrically connect the ground plane to the top plate.

29. An integrated circuit package as claimed in claim 25 wherein the integrated circuits are microwave integrated circuits.

30. An integrated circuit package as claimed in claim 25 wherein the integrated circuits are mm-wave integrated circuits.

31. An integrated circuit package as claimed in claim 25 wherein the dielectric package substrate, the outer dielectric wall and the second and third dielectric walls are comprised of ceramic.

32. An integrated circuit package as claimed in claim 31 wherein the dielectric walls are integrally manufactured with the dielectric package substrate.

33. An integrated circuit package as claimed in claim 31 wherein the dielectric walls are formed separately from the dielectric package substrate and the dielectric walls are attached to the dielectric package substrate by means of an adhesive.

34. An integrated circuit package as claimed in claim 25 wherein the wavelength of the signal carried by the at least one conductive transmission line is $\lambda$ and the distance between the inner dielectric wall and the outer dielectic wall is substantially $\lambda/4$.

35. An integrated circuit package as claimed in claim 25 wherein the wavelength of the signal is of microwave or mm-wave frquencies.

* * * * *